(12) United States Patent
Biberidis et al.

(10) Patent No.: US 10,706,948 B2
(45) Date of Patent: Jul. 7, 2020

(54) MULTI-LEVEL MEMORY SAFETY OF A SENSOR INTEGRATED CIRCUIT

(71) Applicant: Allegro MicroSystems, LLC, Manchester, NH (US)

(72) Inventors: Nicolas Rafael Biberidis, Barcelona (ES); Octavio H. Alpago, Ciudad de Buenos Aires (AR); Nicolas Rigoni, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/033,722

(22) Filed: Jul. 12, 2018

(65) Prior Publication Data

US 2020/0020412 A1    Jan. 16, 2020

(51) Int. Cl.
| | |
|---|---|
| *G11C 29/38* | (2006.01) |
| *G06F 11/10* | (2006.01) |
| *G11C 29/52* | (2006.01) |
| *G01R 33/07* | (2006.01) |
| *G01R 33/09* | (2006.01) |
| *G11C 29/44* | (2006.01) |
| *G11C 11/56* | (2006.01) |

(52) U.S. Cl.
CPC ............ *G11C 29/38* (2013.01); *G01R 33/077* (2013.01); *G01R 33/09* (2013.01); *G06F 11/1068* (2013.01); *G11C 29/44* (2013.01); *G11C 29/52* (2013.01); *G11C 11/56* (2013.01)

(58) Field of Classification Search
CPC ........................................................ G11C 29/38
USPC ........................................ 714/764, 766, 767
See application file for complete search history.

(56) References Cited

U.S. PATENT DOCUMENTS

| | | | |
|---|---|---|---|
| 8,736,260 B2 | 5/2014 | Foletto et al. | |
| 9,395,391 B2 | 7/2016 | Fernandez et al. | |
| 9,644,999 B2 | 5/2017 | Foletto et al. | |
| 9,753,869 B2 * | 9/2017 | Baryudin | G06F 21/78 |
| 2007/0208981 A1 * | 9/2007 | Restrepo | H02H 1/0015 714/731 |
| 2014/0064479 A1 * | 3/2014 | Manikandan | H03M 7/3062 380/28 |
| 2015/0248331 A1 * | 9/2015 | Armstrong | G06F 11/1076 714/764 |
| 2018/0166495 A1 * | 6/2018 | Ang | H01L 27/14683 |

OTHER PUBLICATIONS

U.S. Appl. No. 15/967,822, filed May 1, 2018, Aaron Cook et al.

* cited by examiner

*Primary Examiner* — Fritz Alphonse
(74) *Attorney, Agent, or Firm* — Daly, Crowley, Mofford & Durkee, LLP (57) ABSTRACT

A method for multi-level memory safety for a sensor integrated circuit can include loading a blocking bit into a volatile memory from a non-volatile memory and providing the blocking bit to a gating circuit from the volatile memory. Further, the method may include the gating circuit determining whether to provide a default value to a functional logic based upon the provided blocking bit.

32 Claims, 4 Drawing Sheets

MULTI-LEVEL MEMORY SAFETY OF A SENSOR INTEGRATED CIRCUIT

CROSS REFERENCE

Not applicable.

STATEMENT REGARDING FEDERALLY SPONSORED RESEARCH

Not applicable.

FIELD

This disclosure relates generally to memory safety circuitry and, more particularly, to a multi-level memory safety circuitry configured to prevent corrupted non-functional logic bits from interfering with functional circuitry.

BACKGROUND

In the field of sensor integrated circuits, functional logic, or more generally functional circuitry, is used in various operations necessary for the sensor integrated circuit to be fully and accurately operational during a normal, or functional mode of operation. Sensor operations other than those performed during normal operation can be referred to as non-functional modes and may include testing modes, debugging modes, calibration modes, Discrete Fourier Transform testing, etc. Non-functional logic may be present within the sensor integrated circuit and may rely on non-functional logic bits such as analog values, bits stored in memory, hardline values, etc. for its operation.

However, the non-functional logic bits may become corrupted under various circumstances, such as when power is interrupted to the sensor integrated circuit, from static faults, from dynamic faults, from digital aging or when the sensor integrated circuit is reset to name a few examples. When the non-functional logic bits become corrupted, the functional logic circuitry of the sensor integrated circuit may no longer perform the necessary operations accurately. This may lead to failures within the sensor integrated circuit.

SUMMARY

According to the disclosure, a method for multi-level memory safety for a sensor integrated can include loading a blocking bit into a volatile memory from a non-volatile memory. The method can also include providing the blocking bit to a gating circuit from the volatile memory. Further, the method may include the gating circuit determining whether to provide a default value to a functional logic based upon the provided blocking bit.

With this arrangement, multi-level memory safety is achieved. Because the gating provides a default value based on a blocking bit, corrupted non-functional logic bits are prevented from being provided to the functional circuits. Further, redundancy for the blocking bit can be provided by having it stored in the non-volatile and volatile memories.

Features may include one or more of the following individually or in combination with other features. The method can include determining whether a bit stored in the non-volatile memory is corrupted. The bit may be a blocking bit. Further, the method may include placing the functional logic in a safe state if the bit stored in the non-volatile memory is determined to be corrupted. Also, the method may include determining whether data stored in the non-volatile memory is corrupted and returning the functional logic to a functional state from the safe state when the data stored in the non-volatile memory is determined not to be corrupted.

In embodiments, the method can also include determining whether the bit stored in the non-volatile memory is correctable. If the bit is determined not to be correctable, the method may include placing the functional logic in a safe state.

In embodiments, the method can further include determining whether a bit loaded into the volatile memory is corrupted. The bit may be the blocking bit. If the bit is determined to be corrupted, the method can include reloading the bit loaded from the non-volatile memory into the volatile memory. Also, the method can include determining whether the bit loaded into the volatile memory is correctable and reloading the bit loaded into the volatile memory from the non-volatile memory if the bit is determined not to be correctable.

In embodiments, the blocking bit is loaded from the non-volatile memory into the volatile memory when the sensor integrated circuit is powered on and/or reset. In embodiments, the method can include resetting a digital output when the sensor integrated circuit is powered on.

Also described is a multi-level memory safety system for a sensor integrated circuit that includes a non-volatile memory coupled to a volatile memory and configured to load a blocking bit into the volatile memory. The safety system can also include a gating circuit coupled to the volatile memory and configured to receive the blocking bit from the volatile memory. The gating circuit can further be configured to output a default value according to the received blocking bit.

Features may include one or more of the following individually or in combination with other features. An error correction circuit can be coupled to the non-volatile memory and configured to determine if a bit stored in the non-volatile memory is corrupted. The bit stored in the non-volatile memory may be the blocking bit.

In embodiments, the error correction circuit can also be configured to correct the bit stored in the non-volatile memory.

In embodiments, the safety system can also include a processor configured to place the sensor integrated circuit into a safe mode when the bit stored in the non-volatile memory is determined to be corrupted. The processor can further be configured to return the sensor integrated circuit into a functional mode when the bit stored in the non-volatile memory is corrected.

In embodiments, the safety system can further include an error correction circuit coupled to the volatile memory. The error correction circuit can be configured to determine if a bit loaded into the volatile memory is corrupted. The bit loaded into the volatile memory can be the blocking bit. The error correction circuit coupled to the volatile memory can also be configured to correct the bit loaded into the volatile memory.

In embodiments, the non-volatile memory is configured to reload the bit into the volatile memory when the bit loaded into the volatile memory is determined to be corrupted.

In embodiments, the gating circuit includes at least one multiplexer configured to receive the blocking bit from the volatile memory. The multiplexer can further be configured to select one of a value provided by a non-functional logic or the default value according to the blocking bit. Also, the gating circuit can include at least one flip-flop coupled to at least one multiplexer.

In embodiments, the sensor integrated circuit includes at least one of temperature sensor, speed sensor, angle sensor, proximity sensor, rotation sensor, torque sensor, accelerometer, or current sensor.

According to a further aspect, a multi-level memory safety system for a sensor integrated circuit includes means for loading a blocking bit from a non-volatile memory into a volatile memory when the sensor integrated circuit is powered on. Further, the safety system can include means for determining whether loading the blocking bit into the volatile memory was successful and means for providing a default value to a functional logic according to the loaded blocking bit.

The safety system may also include means for placing the sensor integrated circuit into a safe mode when loading the blocking bit into the volatile memory is determined to be unsuccessful and means for determining whether the loaded blocking bit in the volatile memory is corrupted.

BRIEF DESCRIPTION OF THE DRAWINGS

The concepts, structures, and techniques sought to be protected herein may be more fully understood from the following detailed description of the drawings, in which.

The drawings are not necessarily to scale, or inclusive of all elements of a system, emphasis instead generally being placed upon illustrating the concepts, structures, and techniques sought to be protected herein.

DETAILED DESCRIPTION

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses one or more magnetic field sensing elements, generally in combination with other circuits. The magnetic field sensor can be, for example, a rotation detector, a movement detector, a current sensor, or a proximity detector.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Figure 1:
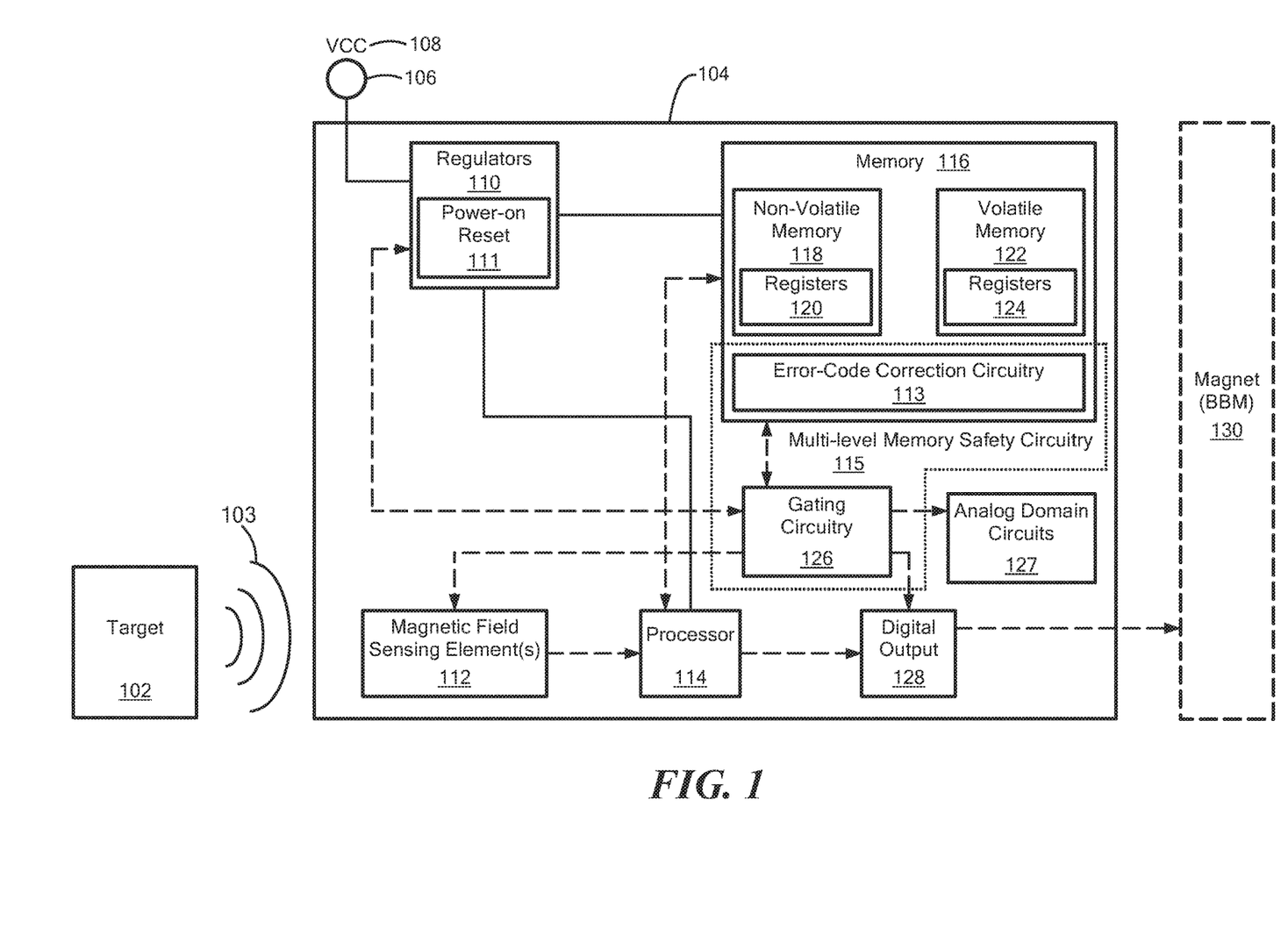
FIG. 1 is a block diagram of a sensor integrated circuit with multi-level memory safety, according to the disclosure.

Referring now to FIG. 1, a sensor integrated circuit ("IC") 104 includes multi-level memory safety circuitry 115 and various circuitry, as may include regulators 110, power-on reset circuitry 111, magnetic field sensing elements 112, processor, 114, memory 116, analog domain circuits 127, and digital output 128.

The sensor IC 104 can include functional logic configured to perform various operations during a functional, or normal mode of operation of sensor IC 104, such as the generation of signals for communication protocols, the generation of analog control signals, operations of a digital processor or digital signal processor ("DSP"), or any combination thereof, to name a few examples.

The sensor IC 104 can also include non-functional logic configured to perform operations during a non-functional mode of operation, such as a debugging mode, calibration mode, testing mode, or any combination thereof, to name a few. For example, during a non-functional mode, the non-functional logic can perform operations such as the generation of non-volatile memory write related signals, the generation of memory read signals, the generation of charge pump control signals, the generation of Discrete Fourier Transform ("DFT") signals, the generation of signals for scan chain testing, or any combination thereof—to name a few. Additional examples non-functional logic bits can include volatile bits for electronically erasable programmable read-only memory ("EEPROM") debugging and testing, volatile bits for DSP calibration and debugging, or any combination thereof. The non-functional logic bits can include one or more volatile or non-volatile bits comprising constant values, variables, global values, or any combination thereof used in the testing, calibration, and debugging processes.

In embodiments, non-functional logic bits can become corrupted due to various circumstances such as when power is interrupted to the sensor integrated circuit, from static faults, from dynamic faults, from digital aging, when the sensor integrated circuit is reset, or any combination thereof, to name a few examples. Although the non-functional logic bits are not used during normal sensor operation, their malfunction could affect the normal sensor operation. For example, corruption of non-functional logic bits as may be used for EEPROM debugging and testing or signal processor calibration and debugging could adversely impact the functionality of the EEPROM or signal processor during normal (functional) operation. Multi-level memory safety circuitry 115 is configured to prevent corrupted non-functional logic bits from interfering with the operations of the functional circuitry.

The sensor IC 104 may take various forms such as the illustrated magnetic field sensor positioned proximate to a target 102. In this context, sensor IC 104 may include one or more magnetic field sensing elements 112, regulators 110, power on reset circuitry 111, memory 116, digital output 128, and analog domain circuits 127.

Magnetic field sensing elements 112 are configured to sense a magnetic field 103 affected by target 102, such as by proximity or movements of target 102 or by a current associated with target 102, for example. Magnetic field sensing elements 112 may take various forms including, but not limited to, one or more Hall effect elements, magnetoresistance ("MR") elements, magnetotransistors, or any combination thereof.

Target 102 may generate and/or alter magnetic field 103 for detection by magnetic field sensing elements 112. According to some embodiments, target 102 comprises a conductive material that allows eddy currents to flow within target 102. Target 102 may comprise a magnetic object (e.g. a hard-ferromagnetic material) or a ferromagnetic object (e.g. a soft ferromagnetic material) that alters magnetic field 103 as the position of target 102 changes relative to sensor IC 104. Target 102 may take many forms, such as a ring magnet with a plurality of magnetic poles or a gear having a plurality of teeth. According to some embodiments, magnetic field 103 may be generated by magnet 130 proximate to magnetic sensor IC 104 which, for example, may comprise a back-bias magnet.

Magnetic field sensing elements 112 detect magnetic field 103 as affected by target 102 in order to thereby detect one or more characteristics (e.g., speed, direction of movement, etc.) of target 102 relative to sensor IC 104. Magnetic field sensing elements 112 further provide a signal representative of the sensed magnetic field ("magnetic field signal") to processor 114. Processor 114 may perform various operations on the magnetic field signal, which may include operations to filter, compare, amplify, etc. the magnetic field signal. Processor 114 may comprise analog circuitry, digital circuitry, a DSP, computer programs, logic circuitry (e.g. a field programmable gate array ("FPGA"), an application-specific integrated circuit (ASIC)), or any combination thereof.

In an embodiment, processor 114 may generate and output a signal ("processor output signal") representative of the detected characteristic of target 102. The signal representative of the output may comprise an analog or digital signal indicating the position of target 102 relative to sensor IC 104, for example. According to some embodiments, the processor output signal may be provided to digital output 128. Digital output 128 may comprise an analog-to-digital converter configured to convert the processor output signal into a digital signal.

According to some embodiments, digital output 128 may further include digital domain circuits configured to perform various operations for sensor IC 104 while sensor IC 104 is in a non-functional mode such as such as digital test operations, digital debugging operations, generation of digital DFT signals (e.g. for Direct Drain Quiescent Current ("IDDQ") testing or SCAN testing), or any combination thereof. The digital domain circuits include one or more digital logic gates, digital circuitry, digital regulators, or any combination thereof.

Sensor IC 104 further includes analog domain circuits 127 configured to perform operations for sensor IC 104 while sensor IC 104 is in a non-functional mode such as analog test operations, analog debugging operations, generation of non-volatile memory write related signals, generation of charge pump control signals, and generation of analog DFT signals. Analog domain circuits 127 include one or more analog logic gates, analog circuitry, analog regulators, or any combination thereof.

Sensor IC 104 includes at least one power pin 106 coupled to an external power source ("VCC") 108. External power source 108 is configured to provide a DC or AC voltage to sensor IC 104 and may include a single output isolated power supply such as a transformer, flyback converter, rectifier, boost converter, buck converter, boost-buck converter, or any combination thereof—to name a few examples. Power pin 106 is configured to couple VCC 108 to regulators 110.

Regulators 110 are configured to provide a regulated voltage to the functional circuitry of sensor IC 104. Regulators 110 may include linear regulators, voltage regulators, current regulators, an IC, solid-state components, vacuum tube components, or any combination thereof, to name a few examples.

Memory 116 includes at least one non-volatile memory 118 with registers 120 and at least one volatile memory 122 with registers 124. Registers 120 and 124 of memory 118 are configured to store functional and non-functional logic bits used in various operations of the functional circuitry of sensor IC 104. Non-volatile memory 118 may include any non-volatile memory, such as, for example, read-only memory ("ROM"), programmable read-only memory ("PROM"), erasable PROM ("EPROM"), EEPROM, flash memory, or any combination thereof. Similarly, volatile memory 122 may include any volatile memory, such as, for example, a random-access memory ("RAM") (e.g. static RAM and dynamic RAM).

In some embodiments, the non-functional logic bits are stored in registers 120, 124 of memory 116.

Power-on reset circuitry 111 may comprise analog and/or digital circuits configured to detect a level of the voltage provided by regulators 110 and to generate a power-on reset signal when the regulated voltage from regulators 110 achieves a predetermined level. For example, the voltage provided by regulators 110 may fall below the minimum operating voltage when VCC 108 falls below a voltage level necessary for regulators 110 to supply the minimum operating voltage, when sensor IC 104 is turned off, or when sensor IC 104 is reset. When the voltage provided by regulators returns to a level equal to or above the minimum operating voltage (such as when sensor IC 104 is powered on), a power-on reset signal is generated by power-on reset circuitry 111. In some embodiments, the power-on reset signal is provided to processor 114.

In some embodiments, processor 114 is configured to perform a power-on reset for sensor IC 104 when a power-on reset signal is received from power-on reset circuitry 111. A power-on reset may comprise setting the functional circuitry of sensor IC 104 to default states, setting a default processor output, setting a default digital output, or any combination thereof.

Processor 114 is further configured to perform a digital reset when a digital reset signal is received. A digital reset signal may be generated by an outside application, a microprocessor, processor 114, or any combination thereof when predetermined conditions are met. A digital reset can include setting the functional circuitry of sensor IC 104 to default states, setting a default processor output, setting a default digital output, or any combination thereof According to some embodiments, a power-on reset or digital reset may further include loading bits stored in non-volatile memory 118 into volatile memory 122. For example, a power-on reset or digital reset may include loading bits stored in registers 120 of non-volatile memory 118 into registers 120 of volatile memory 122. In some embodiments, a power-on reset or digital reset may include loading all the bits stored in non-volatile memory 118 into volatile memory 122 while in other embodiments only predetermined bits may be loaded from non-volatile memory 118 into volatile memory 122.

In some embodiments, the non-functional logic bits stored in memory 116 may become corrupted due to, for example, the voltage provided by regulators 110 falling below the minimum operating voltage, static faults, dynamic faults, digital aging, the sensor integrated circuit being reset (such as from a power-on reset or digital reset), or any combination thereof. The corrupted non-functional logic bits may interfere with the testing, calibration, and debugging operations of the functional circuitry of sensor IC 104 while sensor IC 104 is in a non-functional mode. Interfering with the testing, calibration, and debugging operations of the functional circuitry can, in turn, interfere with the operations of the functional circuitry while sensor IC 104 is in a functional mode. To prevent corrupted non-functional logic bits from interfering with the operations of the functional circuitry, sensor IC 104 includes multi-level memory safety circuitry 115.

Multi-level memory safety circuitry 115 includes gating circuitry 126. Gating circuitry 126 includes circuitry such as flip-flops and multiplexers configured to gate, or block, non-functional logic bits from being provided to the functional circuitry of sensor IC 104 based upon a blocking bit. According to some embodiments, the blocking bit may include data indicating that all non-functional logic bits are to be blocked by gating circuitry 126, while in other embodiments the blocking bit may include data indicating that only predetermined non-functional logic bits are to be blocked. Preventing the non-functional logic bits from being provided to the functional circuitry of sensor 104 aids in ensuring that corrupted non-functional logic bits do not interfere with the operations of the functional circuitry.

The blocking bit may be provided to gating circuitry 126 from volatile memory 122. As discussed below with reference to FIG. 2, multi-level memory safety circuitry 115 includes circuitry configured to ensure that the blocking bit is successfully loaded from non-volatile memory 118 into volatile memory 122. Ensuring that the blocking bit is successfully loaded into volatile memory 122 (and thus successfully provided to gating circuitry 126) further aids in preventing any corrupted non-functional logic bits from being provided to the functional circuits of sensor IC 104 by allowing gating circuitry 126 to function properly.

Gating circuitry 126 is further configured to output safe values to the functional circuitry of sensor IC 104 based upon the blocking bit. The safe values output by gating circuitry 126 may include known values that allow the functional circuitry of sensor IC 104 to operate properly, default values for the non-functional logic bits, last known good values of the non-functional logic bits, or any combination thereof. By only providing safe values to the functional circuitry of sensor IC 104, any potentially corrupted non-functional logic bits are prevented from interfering in the operations of the functional circuits.

Multi-level memory safety circuit 115 further includes error-code correction ("ECC") circuitry 113. As discussed below with reference to FIG. 2, ECC circuitry 113 is coupled to non-volatile memory 118 and volatile memory 122 and is configured to detect and correct corrupted bits stored in non-volatile memory 118, volatile memory 122, or both.

It will be appreciated that while FIG. 1 illustrates multi-level memory safety circuitry 115 implemented in a magnetic field sensor IC 104, the multi-level memory safety circuitry may be implemented in various sensor ICs such as, but not limited to, temperature sensor ICs, speed sensor ICs, angle sensor ICs, proximity sensor ICs, rotation sensor ICs, torque sensor ICs, accelerometer ICs, or current sensor ICs.

Figure 2:
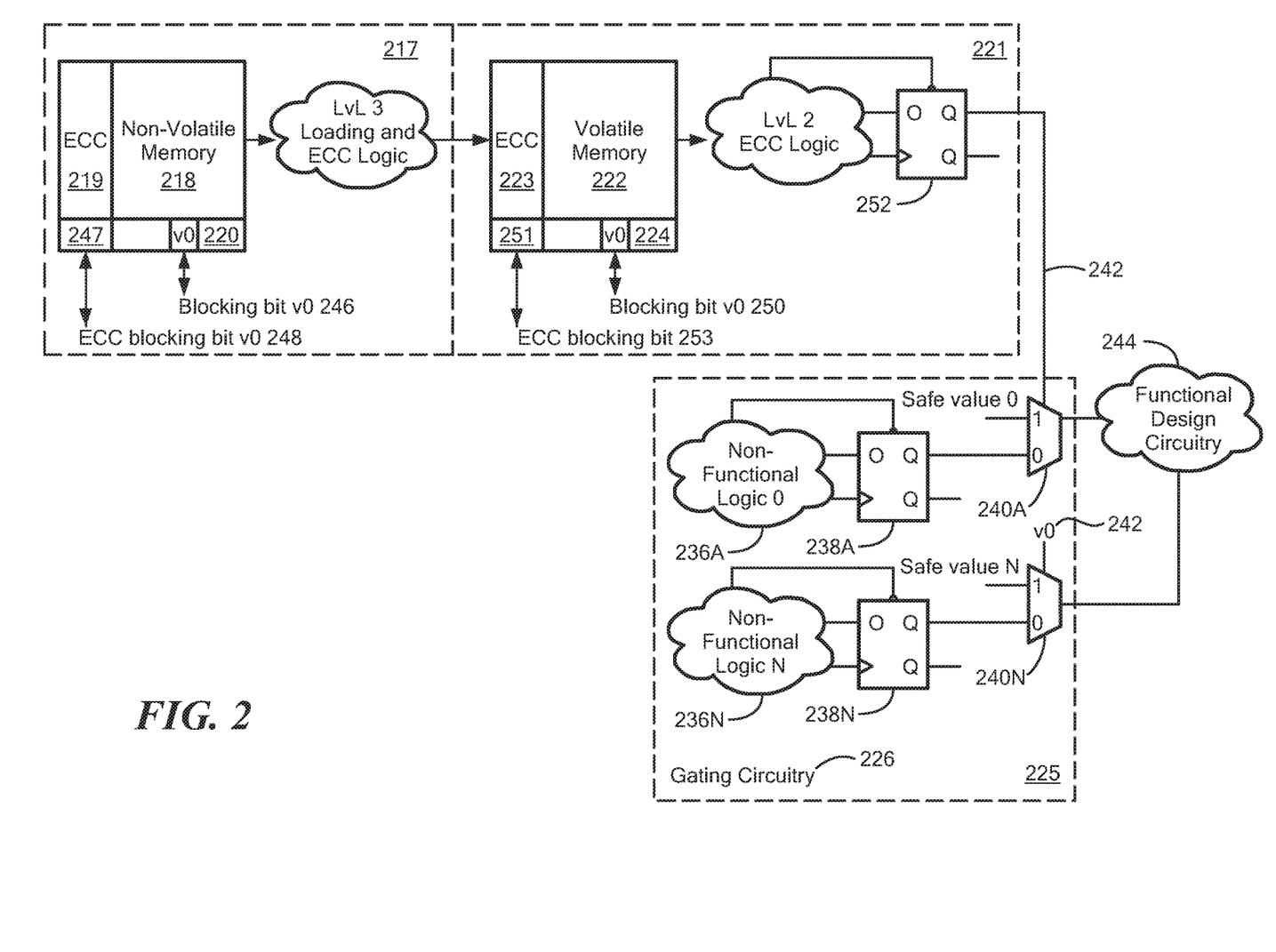
FIG. 2 is a block diagram of multi-level memory safety circuitry, according to embodiments.

Referring now to FIG. 2, multi-level memory safety that may be the same as or similar to multi-level memory safety circuitry 115 of FIG. 1 is shown to include at least three levels of safety circuitry 217, 221, 225 each configured to prevent corrupted non-functional logic bits 236A-236N from interfering with the operations of the functional circuitry 244 of sensor IC 104. It will be appreciated that while in the illustrated embodiment of FIG. 2 three levels of a memory safety circuitry are shown, in other embodiments two or four or more levels may be used.

A third, or "highest", safety circuitry level 217 includes ECC circuitry 219 coupled to a non-volatile memory 218 of memory 116 (FIG. 1). Non-volatile memory 218 may include any non-volatile memory, such as, for example, ROM, PROM, EPROM, EEPROM, flash memory, or any combination thereof. Non-volatile memory 218 is configured to store at least a blocking bit v0 246 in registers 220. According to some embodiments non-volatile memory 218 is further configured to store non-functional logic bits 236A-N used in the operations of the functional circuitry 244 of sensor IC 104.

ECC circuit 219 is coupled to non-volatile memory 218 and is configured to detect if one or more bits stored in non-volatile memory 218 are corrupted. ECC circuit 219 may include, for example, parity bit circuitry, hamming code circuitry, SEC-DEC code circuitry, check matrix circuitry, or any combination thereof. According to some embodiments, ECC circuit 219 may be configured to determine if any bit stored in non-volatile memory 218 is corrupted while in other embodiments, ECC circuit 219 may be configured to determine if a predetermined, or specific, bit or number of bits stored in non-volatile memory 218 is corrupted, such as blocking bit v0 246.

According to some embodiments, ECC circuit 219 is further configured to generate a safe mode signal if a bit stored in non-volatile memory 218 is determined to be corrupted. The safe mode signal may be provided to processor 114 (FIG. 1). In some embodiments, processor 114 may be configured to place sensor IC 104 into a safe mode when a safe mode signal is received. A safe mode may include placing sensor IC 104 into a non-functional mode (such as a testing mode or a debugging mode), placing sensor IC 104 into an functional mode with limited operation, generating an error signal, generating an error flag, placing functional circuitry 244 into known safe states (such as testing states or debugging states), resetting the digital output 128 to a predetermined default state, resetting the processor output signal to a predetermined default state, or any combination thereof. For example, placing sensor IC 104 into a safe mode may include leaving sensor IC in a functional mode while an error signal is generated indicating an error has occurred. The error signal may indicate which bit stored in non-volatile memory 218 is corrupted and may prevent functional circuitry 244 from performing operations affected by the indicated corrupted bit.

In some embodiments, ECC circuit 219 may include registers 247. Registers 247 may be configured to store last known good values, default values, or safe values for bits stored in non-volatile memory 218. For example, registers 247 may store an ECC blocking bit 248 which includes a last known good value for blocking bit v0 246 stored in non-volatile memory 218.

ECC circuit 219 is further configured to correct detected corrupted bits of non-volatile memory 218. ECC circuit 219 may, for example, correct detected corrupted bits of non-volatile memory 218 by comparing them to corresponding values stored in registers 247 of ECC circuit 219. In some embodiments, ECC circuit 219 may generate a signal indicating that the detected corrupted bit(s) of non-volatile memory 218 have been corrected and provide this signal to processor 114. Processor 114 may be further configured to return sensor IC 104 to a functional state from a safe state when a signal indicating that the detected corrupted bits of non-volatile memory 218 have been corrected is received.

According to some embodiments, ECC circuit 219 may determine that the detected corrupted bits are not correctable (i.e. ECC circuit 219 cannot correct the detected corrupted bits). In some embodiments, ECC circuit 219 may generate a signal indicating that the detected corrupted bits of non-volatile memory 218 are not correctable and provide the signal to processor 114. Processor 114 may be further configured to place magnetic field sensor IC 104 into a safe mode when a signal indicating that the detected corrupted bits of non-volatile memory 218 are not corrected is received.

Placing sensor IC 104 into a safe mode when a bit of non-volatile memory 218 is determined to be corrupted, not correctable, or both further aids in ensuring that corrupted non-functional logic bits do not interfere in the operations of functional circuitry 244. In a safe mode, sensor IC 104 may be placed in a functional mode with limited operation or may generate an error signal indicating the error that occurred. Due to this, sensor IC 104 may prevent operations of the functional circuitry that are affected by a corrupted bit indicated by the error signal.

A second level of memory safety circuitry 221 is configured to ensure that bits are successfully loaded from non-volatile memory 218 into volatile memory 222 and includes ECC circuitry 223 coupled to volatile memory 222. As discussed above with reference to FIG. 1, processor 114 may be configured to load bits stored in non-volatile memory 218 into volatile memory 222 during a power-on reset or digital reset. Volatile memory 222 may comprise any volatile memory, such as, for example, a RAM (e.g. static RAM and dynamic RAM). Volatile memory 222 is configured to store at least a blocking bit v0 250 in registers 224. Blocking bit v0 250 is representative of blocking bit v0 246 as loaded into volatile memory 222 from non-volatile memory 218.

ECC circuit 223 is configured to detect if one or more bits loaded into volatile memory 222 from non-volatile memory 218 is corrupted (i.e. if the bits from non-volatile memory 218 were loaded successfully into volatile memory 222). ECC 223 circuit may include, for example, parity bit circuitry, hamming code circuitry, SEC-DEC code circuitry, check matrix circuitry, or any combination thereof. According to some embodiments, ECC circuit 223 may be configured to determine if any bit loaded into volatile memory 222 is corrupted while in other embodiments, ECC 223 may be configured to determine if a predetermined, or specific, bit or number of bits loaded into volatile memory 222 is corrupted, such as blocking bit v0 250.

According to some embodiments, ECC circuit 223 is further configured to generate a signal indicating that a bit loaded into volatile memory 222 is corrupted (i.e. a bit has been loaded into volatile memory 222 unsuccessfully). According to some embodiments, the signal indicating that a bit loaded into volatile memory 222 is corrupted may be provided to processor 114. In some embodiments, processor 114 may be further configured to reload bits stored in registers 220 of non-volatile memory 218 into registers 224 of volatile memory 222 when a signal indicating that a bit loaded into volatile memory 222 is corrupted is received.

In some embodiments, ECC circuit 223 may include registers 251. Registers 251 may be configured to store bits loaded from registers 247 of ECC circuit 219. For example, registers 251 may store an ECC blocking bit 253 which is representative of ECC blocking bit 248 loaded in from registers 247.

ECC circuit 223 is further configured to correct one or more detected corrupted bits loaded into volatile memory 222. ECC circuit 223 may, for example, correct one or more detected corrupted bits of volatile memory 222 by comparing them to corresponding values stored in registers 251 of ECC circuit 223. In some embodiments, ECC circuit 223 may correct detected corrupted bits as a background process while sensor IC 104 is in a functional mode (i.e. a mode that allows for functional circuitry 244 to conduct normal operations).

In some embodiments, ECC circuit 223 may determine that the detected corrupted bits are not correctable (i.e. the bits stored in registers 247 have failed and ECC circuit 223 cannot correct the detected corrupted bits). According to some embodiments, ECC circuit 223 may generate a signal indicating that the detected corrupted bits of volatile memory 222 are not correctable and provide the signal to processor 114. Processor 114 may be further configured to reload the bits stored in non-volatile memory 218 into volatile memory 222 when a signal indicating that the detected corrupted bits of volatile memory 222 are not correctable is received.

Reloading the bits into volatile memory 222 when a bit stored in volatile memory 222 is determined to be corrupted, not correctable, or both, prevents corrupted non-functional logic bits stored in volatile memory 222 from being provided to functional circuitry 244. Further, ensuring that the bits are loaded successfully from non-volatile memory 218 into volatile memory 222 prevents blocking bit v0 250 from becoming corrupted, thus allowing gating circuitry 226 to operate properly.

Second level of memory safety circuitry 221 may further include flip-flop 252 coupled to volatile memory 222. Flip-flop 252 may include D flip-flops, T flip-flops, JK flip-flops, or any combination thereof and is configured to receive blocking bit v0 250 from volatile memory 222. Flip-flop 252 is further configured to output a blocking bit v0 242. Blocking bit v0 242 is representative of blocking bit v0 250 as provided from volatile memory 222 after one clock cycle of sensor IC 104 (such as one clock cycle of processor 114). Blocking bit v0 242 is provided to a first level of a memory safety circuitry 225.

A first or "lowest" level of a memory safety circuitry 225 includes gating circuitry 226 configured to gate, or block, values of the non-functional logic bits 236A-236N from being provided to functional circuitry 244 based upon blocking bit v0 242. Gating circuitry 226 includes one more multiplexers 240A-240N, each coupled to one or more flip-flops 238A-238N, as shown. Flip-flops 238A-238N may include D flip-flops, T flip-flops, JK flip-flops, or any combination thereof. Each flip-flop 238A-238N is coupled to a non-functional logic bit 236A-236N and is configured to provide the respective non-functional logic bit to a respective multiplexer 240A-240N. As discussed further below with reference to FIG. 3, each multiplexer 240A-240N is configured to select one of a respective non-functional logic bit 236A-236N or a corresponding safe value (e.g., safe value 0-safe value N) based upon blocking bit v0 242. Each safe value may include one or more known, or predetermined, safe values for the non-functional logic bits that allow functional circuitry 244 to operate without interference. Each value selected by a multiplexer 240A-240N is provided to functional circuitry 244.

Figure 3:
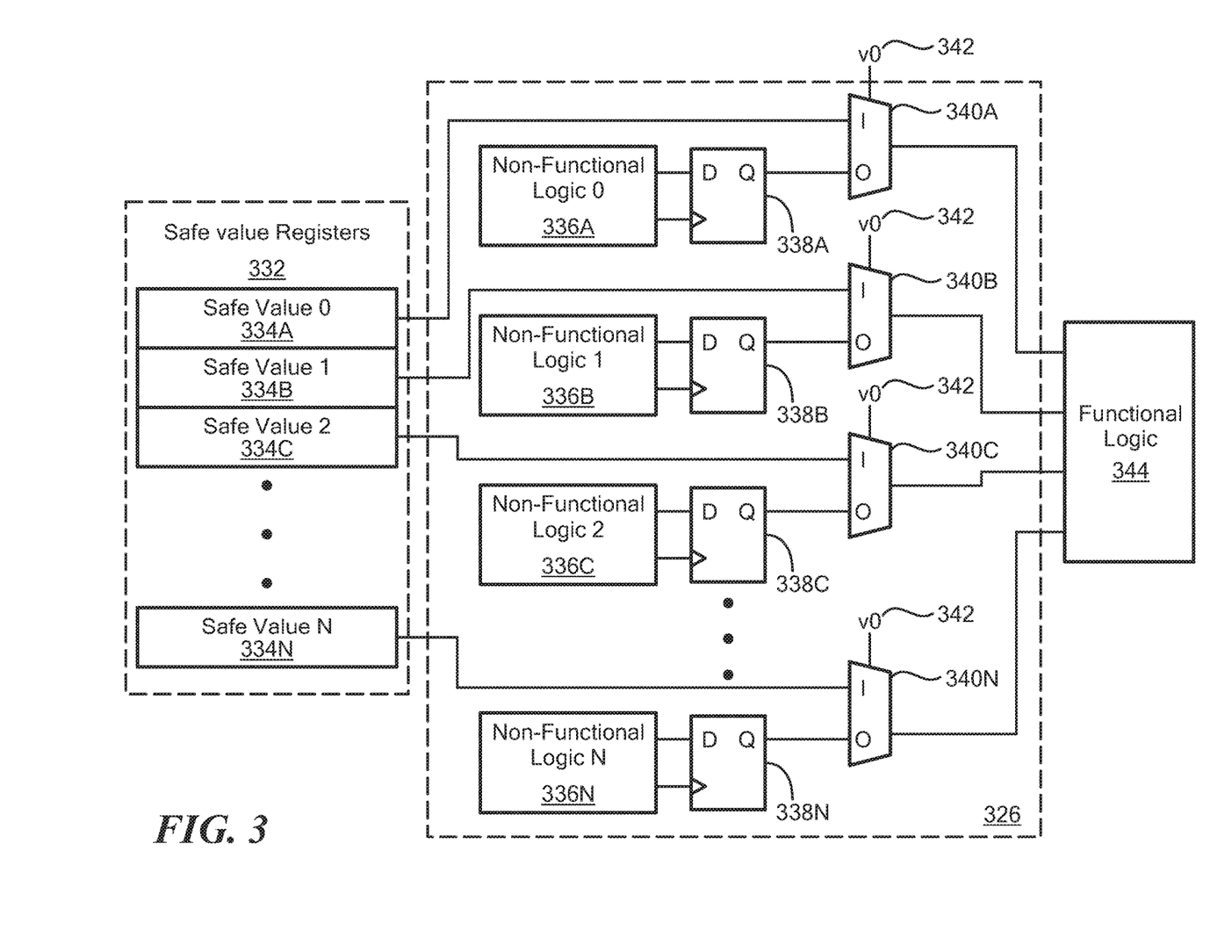
FIG. 3 is a block diagram of a gating circuitry, according to embodiments.

Referring now to FIG. 3, a block diagram of a first level of multi-level memory safety circuitry as may correspond to safety circuitry level 225 of FIG. 2 is provided. Thus, the first level of memory safety circuitry can include gating circuitry 326 and safe values 332. Gating circuitry 326 includes a plurality of flip-flops 338A-338N, each coupled to a respective non-functional logic bit 336A-336N. According to some embodiments, the number of flip-flops 338A-338N may be equal to the number of non-functional logic bits, while in other embodiments the number may differ. In the illustrative embodiment of FIG. 3, the number of flip-flops 338A-338N and the number of non-functional logic bits 336A-336N are equal, with each having N number.

Each flip-flop 338A-338N is configured to output the respective non-functional logic bit 336A-336N. According to some embodiments, the output of each flip-flop 338A-338N may comprise the non-functional logic bit after one clock cycle for sensor IC 104. Each flip-flop 338A-338N is further coupled to a respective multiplexer 340A-340N and is configured to provide the coupled non-functional logic value 336 to the respective multiplexer. For example, flip-flop 338A is coupled to multiplexer 340A and is configured to provided non-functional logic bit 0 336A to multiplexer 340A.

Each multiplexer 340A-340N is further coupled to receive a respective safe value 334A-334N corresponding to the non-functional logic bit 336A-336N provided to the respective multiplexer 340A-340N. Each safe value 334A-334N may include a known good, or safe, value for a respective non-functional logic bit 336A-336N. In other words, each safe value 334A-334N may include a known good value for a corresponding non-functional logic bit 336A-336N that allows functional circuitry 344 to operate normally. According to some embodiments, safe values 334A-334N may be stored in non-volatile memory 118, while in other embodiments, safe values 334A-334N may be analog values provided by sensor IC 104. In some embodiments, safe values 334A-334N may be stored in safe value registers 332. Safe value registers 332 may comprise a memory such as, for example, RAM, ROM, PROM, EPROM, flash memory, hard drive, or any combination thereof.

Each multiplexer 340A-340N is configured to select between the received non-functional logic bit 336A-336N and corresponding safe value 334A-334N based upon blocking bit v0 342. The selected value is then provided to the functional circuitry 344. As discussed above, blocking bit v0 342 may be provided to gating circuitry 326 from volatile memory 222. According to some embodiments, blocking bit v0 342 includes data indicating that each multiplexer 340A-340N is to select a safe value 334A-334N, thus blocking non-functional logic bits 336 from being provided to functional circuitry 344. By blocking the non-functional logic bits 336A-336N and only allowing safe values 334A-334N to be provided to functional circuitry 344, corruption of the non-functional logic bits 336A-336N will not interfere with the proper, intended operations of the functional circuitry 344.

Figure 4:
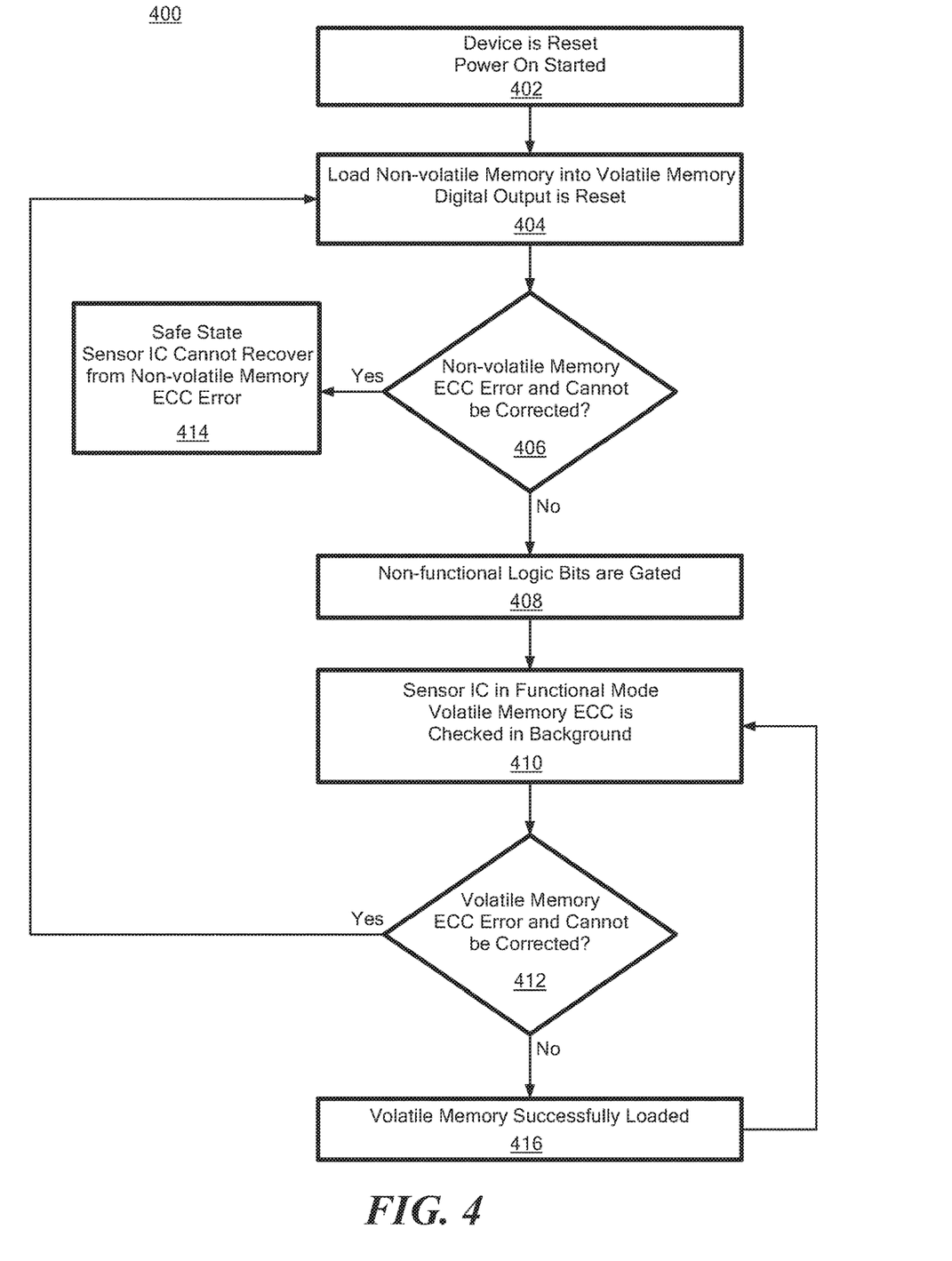
FIG. 4 is a flow chart of a process for multi-level memory safety, according to embodiments.

Referring now to FIG. 4, a process for multi-level memory safety is provided. At 402, processor 114 initiates a power-on reset or digital reset for sensor IC 104. At 404, bits stored in non-volatile memory 218 (FIG. 2) are loaded into volatile memory 222. According to some embodiments, further at 404, an output of digital output 126 (FIG. 1) is reset to a default, or known safe, value.

At 406, ECC 219 determines whether any bit stored in non-volatile memory 218 is corrupted. Further at 406, ECC 219 determines whether any bit detected to be corrupted is correctable. If ECC 219 determines that any bit stored in non-volatile memory 218 is corrupted and not correctable, then the system moves to 414, otherwise the system moves to 408. At 414, when any bit of volatile memory 218 is determined to be corrupted and not correctable, processor 114 places sensor IC into a safe state.

At 408, a blocking bit is provided from volatile memory 222 to gating circuitry 226, thus allowing gating circuitry 226 to block non-functional logic bits from being provided to the functional circuitry of sensor IC 104. At 410, processor 114 places sensor IC 104 into a functional operating mode, thus allowing the functional circuitry of sensor IC 104 to perform normal operations. According to some embodiments, at 410, ECC circuit 223 may determine if any bits stored in volatile memory 222 are corrupted as a background operation of sensor IC 104.

At 412, ECC 223 determines whether any bit loaded into volatile memory 222 is corrupted. In other words, ECC 223 determines whether the bits were loaded successfully from non-volatile memory 218 into volatile memory 222. Further, at 412, ECC 223 determines whether any bit determined to be corrupted is correctable. If ECC 223 determines that any bit loaded into volatile memory 222 is corrupted and not correctable, then the system repeats 404, reloading the bits stored in non-volatile memory 218 into volatile memory 222, otherwise the system moves to 416. At 416, loading the bits from non-volatile memory 218 into volatile memory 222 is determined to be successful because no bits of non-volatile memory 218 are corrupted or not correctable. The system then repeats 410.

Having described exemplary embodiments, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method for multi-level memory safety for a sensor integrated circuit, comprising:
    loading, from a non-volatile memory, a blocking bit into a volatile memory;
    providing, from the volatile memory, the blocking bit to a gating circuit; and
    determining, via the gating circuit, whether to provide a default value to a functional logic based upon the provided blocking bit.

2. The method for multi-level memory safety of claim 1, further comprising determining whether a bit stored in the non-volatile memory is corrupted.

3. The method for multi-level memory safety of claim 2, wherein the bit stored in the non-volatile memory comprises the blocking bit.

4. The method for multi-level memory safety of claim 2, further comprising placing the functional logic in a safe state if the bit stored in the non-volatile memory is determined to be corrupted.

5. The method for multi-level memory safety of claim 4, further comprising:
    determining whether data stored in the non-volatile memory is corrupted; and
    returning the functional logic to a functional state from the safe state when the data stored in the non-volatile memory is determined not to be corrupted.

6. The method for multi-level memory safety of claim 2, further comprising determining whether the bit stored in the non-volatile memory is correctable.

7. The method for multi-level memory safety of claim 6, further comprising placing the functional logic in a safe state if the bit stored in the non-volatile memory is determined not to be correctable.

8. The method for multi-level memory safety of claim 1, further comprising determining whether a bit loaded into the volatile memory is corrupted.

9. The method for multi-level memory safety of claim 8, wherein the bit loaded into the volatile memory comprises the blocking bit.

10. The method for multi-level memory safety of claim 8, further comprising reloading the bit loaded from the non-volatile memory into the volatile memory if the bit loaded into the volatile memory is determined to be corrupted.

11. The method for multi-level memory safety of claim 8, further comprising determining whether the bit loaded into the volatile memory is correctable.

12. The method for multi-level memory safety of claim 11, further comprising reloading the bit loaded into the volatile memory from the non-volatile memory if the bit loaded into the volatile memory is determined not to be correctable.

13. The method for multi-level memory safety of claim 1, wherein the blocking bit is loaded from the non-volatile memory into the volatile memory when the sensor integrated circuit is powered on.

14. The method for multi-level memory safety of claim 1, wherein the blocking bit is loaded from the non-volatile memory into the volatile memory when the sensor integrated circuit is reset.

15. The method for multi-level memory safety of claim 1, further comprising resetting a digital output when the sensor integrated circuit is powered on.

16. A multi-level memory safety system for a sensor integrated circuit, comprising:
    a non-volatile memory coupled to a volatile memory and configured to load a blocking bit into the volatile memory; and
    a gating circuit coupled to the volatile memory and configured to receive the blocking bit from the volatile memory;
    wherein the gating circuit is further configured to output a default value according to the received blocking bit.

17. The multi-level memory safety system of claim 16, further comprising an error correction circuit coupled to the non-volatile memory and configured to determine if a bit stored in the non-volatile memory is corrupted.

18. The multi-level memory safety system of claim 17, wherein the bit stored in the non-volatile memory comprises the blocking bit.

19. The multi-level memory safety system of claim 18, wherein the error correction circuit is further configured to correct the bit stored in the non-volatile memory.

20. The multi-level memory safety system of claim 19, further comprising a processor configured to place the sensor integrated circuit into a safe mode when the bit stored in the non-volatile memory is determined to be corrupted.

21. The multi-level memory safety system of claim 20, wherein the processor is further configured to return the sensor integrated circuit into a functional mode when the bit stored in the non-volatile memory is corrected.

22. The multi-level memory safety system of claim 16, further comprising an error correction circuit coupled to the volatile memory and configured to determine if a bit loaded into the volatile memory is corrupted.

23. The multi-level memory safety system of claim 22, wherein the bit loaded into the volatile memory comprises the blocking bit.

24. The multi-level blocking bit of claim 23, wherein the error correction circuit coupled to the volatile memory is configured to correct the bit loaded into the volatile memory.

25. The multi-level memory safety system of claim 23, wherein the non-volatile memory is configured to reload the bit into the volatile memory when the bit loaded into the volatile memory is determined to be corrupted.

26. The multi-level memory safety system of claim 16, wherein the gating circuit comprises at least one multiplexer configured to receive the blocking bit from the volatile memory.

27. The multi-level memory safety system of claim 26, wherein the at least one multiplexer is further configured to select one of a value provided by a non-functional logic or the default value according to the blocking bit.

28. The multi-level memory safety system of claim 16, wherein the gating circuit comprises at least one flip-flop coupled to at least one multiplexer.

29. The multi-level memory safety system of claim 16, wherein the sensor integrated circuit comprises at least one of a temperature sensor, speed sensor, angle sensor, proximity sensor, rotation sensor, torque sensor, accelerometer, or current sensor.

30. A multi-level memory safety system for a sensor integrated circuit, comprising:
    means for loading a blocking bit from a non-volatile memory into a volatile memory when the sensor integrated circuit is powered on;
    means for determining whether loading the blocking bit into the volatile memory was successful; and
    means for providing a default value to a functional logic according to the loaded blocking bit.

31. The multi-level memory safety system of claim 30, further comprising means for placing the sensor integrated circuit into a safe mode when loading the blocking bit into the volatile memory is determined to be unsuccessful.

32. The multi-level memory safety system of claim 30, further comprising means for determining whether the loaded blocking bit in the volatile memory is corrupted.

* * * * *